US012249492B2

(12) United States Patent
Hirayama et al.

(10) Patent No.: US 12,249,492 B2
(45) Date of Patent: Mar. 11, 2025

(54) ELECTROSTATIC CHUCK DEVICE

(71) Applicant: SUMITOMO OSAKA CEMENT CO., LTD., Tokyo (JP)

(72) Inventors: Masaki Hirayama, Tokyo (JP); Tetsuro Itagaki, Tokyo (JP)

(73) Assignee: SUMITOMO OSAKA CEMENT CO., LTD., Tokyo (JP)

(*) Notice: Subject to any disclaimer, the term of this patent is extended or adjusted under 35 U.S.C. 154(b) by 190 days.

(21) Appl. No.: 17/999,823

(22) PCT Filed: May 27, 2021

(86) PCT No.: PCT/JP2021/020234
§ 371 (c)(1),
(2) Date: Nov. 23, 2022

(87) PCT Pub. No.: WO2022/004211
PCT Pub. Date: Jan. 6, 2022

(65) Prior Publication Data
US 2023/0215704 A1    Jul. 6, 2023

(30) Foreign Application Priority Data
Jun. 29, 2020   (JP) ................. 2020-111804

(51) Int. Cl.
*H01J 37/32* (2006.01)
*H01L 21/683* (2006.01)

(52) U.S. Cl.
CPC .. *H01J 37/32715* (2013.01); *H01J 37/32541* (2013.01); *H01J 37/32568* (2013.01);
(Continued)

(58) Field of Classification Search
CPC . H02N 13/00; H01L 21/68735; H01L 21/687; H01L 21/6833; H01L 21/683;
(Continued)

(56) References Cited

U.S. PATENT DOCUMENTS

2017/0170047 A1* 6/2017 Nakamura ........ H01L 21/67109
2018/0350561 A1* 12/2018 Yamaguchi ......... H01L 21/6831
2021/0327741 A1* 10/2021 Nagayama .......... H01L 21/6833

FOREIGN PATENT DOCUMENTS

JP      2001110883 A  *  4/2001
JP      2012-134375 A     7/2012
(Continued)

OTHER PUBLICATIONS

Machine translation of Ono Japanese Patent Document JP 2001-110833 A Apr. 2001 (Year: 2001).*
(Continued)

*Primary Examiner* — Kevin J Comber
(74) *Attorney, Agent, or Firm* — Merchant & Gould P.C.

(57) ABSTRACT

An electrostatic chuck device includes: an electrostatic chuck plate having a dielectric substrate having a placement surface on which a wafer is placed and an adsorption electrode positioned in the dielectric substrate; a metal base supporting the electrostatic chuck plate from a back surface side opposite to the placement surface; and a focus ring installed on an outer peripheral portion of the electrostatic chuck plate and surrounding the placement surface. The electrostatic chuck plate has a ring adsorption region which is adsorbed to the focus ring and is located on a surface positioned on the same side as the placement surface and has a base adsorption region which is adsorbed to the metal base and located on a back surface opposite to the placement surface.

20 Claims, 5 Drawing Sheets

(52) U.S. Cl.
CPC .... *H01J 37/32642* (2013.01); *H01L 21/6833* (2013.01); *H01J 37/32577* (2013.01); *H01J 2237/2007* (2013.01)

(58) Field of Classification Search
CPC ............. H01L 21/6875; H01L 21/6831; H01L 21/6838; H01L 21/67109; H01J 37/32568; H01J 37/32715; H01J 37/32541; H01J 37/32642; H01J 37/32577; H01J 2237/2007
USPC ........................................................ 361/234
See application file for complete search history.

(56) References Cited

FOREIGN PATENT DOCUMENTS

| | | |
|---|---|---|
| JP | 2018-206804 A | 12/2018 |
| JP | 2020-047638 A | 3/2020 |
| WO | 2015/111616 A1 | 7/2015 |

OTHER PUBLICATIONS

International Search Report for PCT/JP2021/020234 (Aug. 17, 2021).

\* cited by examiner

ELECTROSTATIC CHUCK DEVICE

TECHNICAL FIELD

The present invention relates to an electrostatic chuck device.

This application is a National Stage Application of PCT/JP2021/020234, filed on May 27, 2021, which claims benefit of priority to Japanese Patent Application No. 2020-111804, filed in Japan on Jun. 29, 2020, the content of which is incorporated herein by reference. To the extent appropriate, a claim of priority is made to each of the above disclosed applications.

BACKGROUND ART

As an electrostatic chuck device supporting a semiconductor wafer, there is known a configuration in which an electrostatic chuck capable of focus ring adsorption is installed on a metallic susceptor as described in, for example, Patent Literature 1. A power supply device for plasma generation is connected to the susceptor.

CITATION LIST

Patent Literature

Patent Literature No. 1: Japanese Laid-open Patent Publication No. 2012-134375

SUMMARY OF INVENTION

Technical Problem

With a rise in wafer processing temperature in semiconductor manufacturing equipment, there is a demand for an electrostatic chuck device capable of high-temperature processing. Specifically, an electrostatic chuck device used for high-temperature wafer processing is required to be reliable enough to withstand thermal stress caused by an inter-portion difference in coefficient of thermal expansion. However, the electrostatic chuck device of the related art has problems such as peeling of a bonded part of the device attributable to thermal stress.

An object of the present invention is to provide a wafer support device highly reliable when used at a high temperature.

Solution to Problem

Provided according to a first aspect of the present invention is an electrostatic chuck device including: an electrostatic chuck plate which has a dielectric substrate having a placement surface on which a wafer is placed and an adsorption electrode which is positioned in the dielectric substrate; a metal base which supports the electrostatic chuck plate from a back surface side opposite to the placement surface; and a focus ring which is installed on an outer peripheral portion of the electrostatic chuck plate and surrounds the placement surface. The electrostatic chuck plate has a ring adsorption region, which is adsorbed to the focus ring and is located on a surface which is positioned on the same side as the placement surface, and has a base adsorption region, which is adsorbed to the metal base and is located on a back surface which is opposite to the placement surface.

The electrostatic chuck device of the first aspect of the present invention preferably includes the features described below. It is also preferable to combine two or more of the following features as necessary.

One or both of the base adsorption region of the electrostatic chuck plate and a surface of the metal base, which faces the base adsorption region, may have a plurality of protrusion portions which are distributed in a planar direction of the electrostatic chuck plate.

Distribution density of the plurality of protrusion portions in the base adsorption region may be different between a region overlapping the placement surface in plan view and a region overlapping the ring adsorption region in plan view.

The adsorption electrode may have a first electrode portion which is positioned in a surface layer part of the dielectric substrate which is located on a placement surface side, a second electrode portion which is positioned in a surface layer part of the dielectric substrate which is located on a metal base side, and a connection pin which connects the first electrode portion and the second electrode portion in the dielectric substrate.

The adsorption electrode may have a third electrode portion which is positioned closer to an outer peripheral side than the first electrode portion and is positioned on a surface layer part of the ring adsorption region.

The electrostatic chuck plate may have a step which is located between the placement surface and the ring adsorption region, and a surface of the ring adsorption region which faces the focus ring may be positioned closer to the metal base than the placement surface.

The electrostatic chuck plate may have a base fixing portion which is fixed to the metal base and located in a middle portion of the back surface thereof in plan view, and the base adsorption region may be disposed to surround the base fixing portion.

Advantageous Effects of Invention

According to one aspect of the present invention, it is possible to provide an electrostatic chuck device highly reliable when used at a high temperature.

DESCRIPTION OF EMBODIMENTS

Preferred examples of each embodiment of the electrostatic chuck device of the present invention will be described below with reference to the drawings. It should be noted that in each of the drawings, the dimensions, proportions, and the like of components may be changed as appropriate so that the drawing is easy to see. Numbers, positions, sizes, members, and so on can be, for example, omitted, added, changed, replaced, and exchanged without departing from the spirit of the present invention.

First Embodiment

Figure 1:
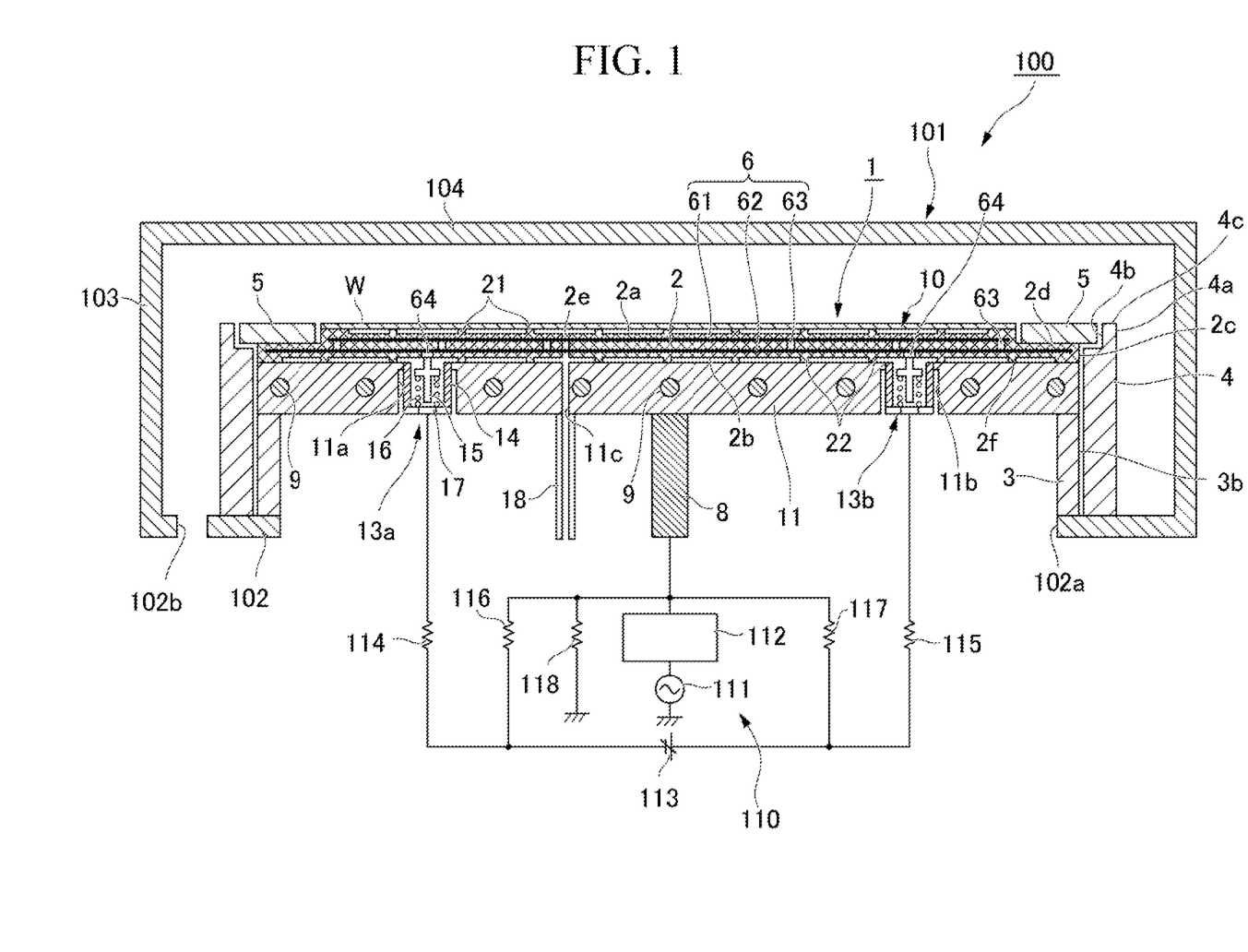
FIG. 1 is a schematic cross-sectional view illustrating a preferred example of a plasma treatment apparatus provided with an electrostatic chuck device of an embodiment.
Figure 2:
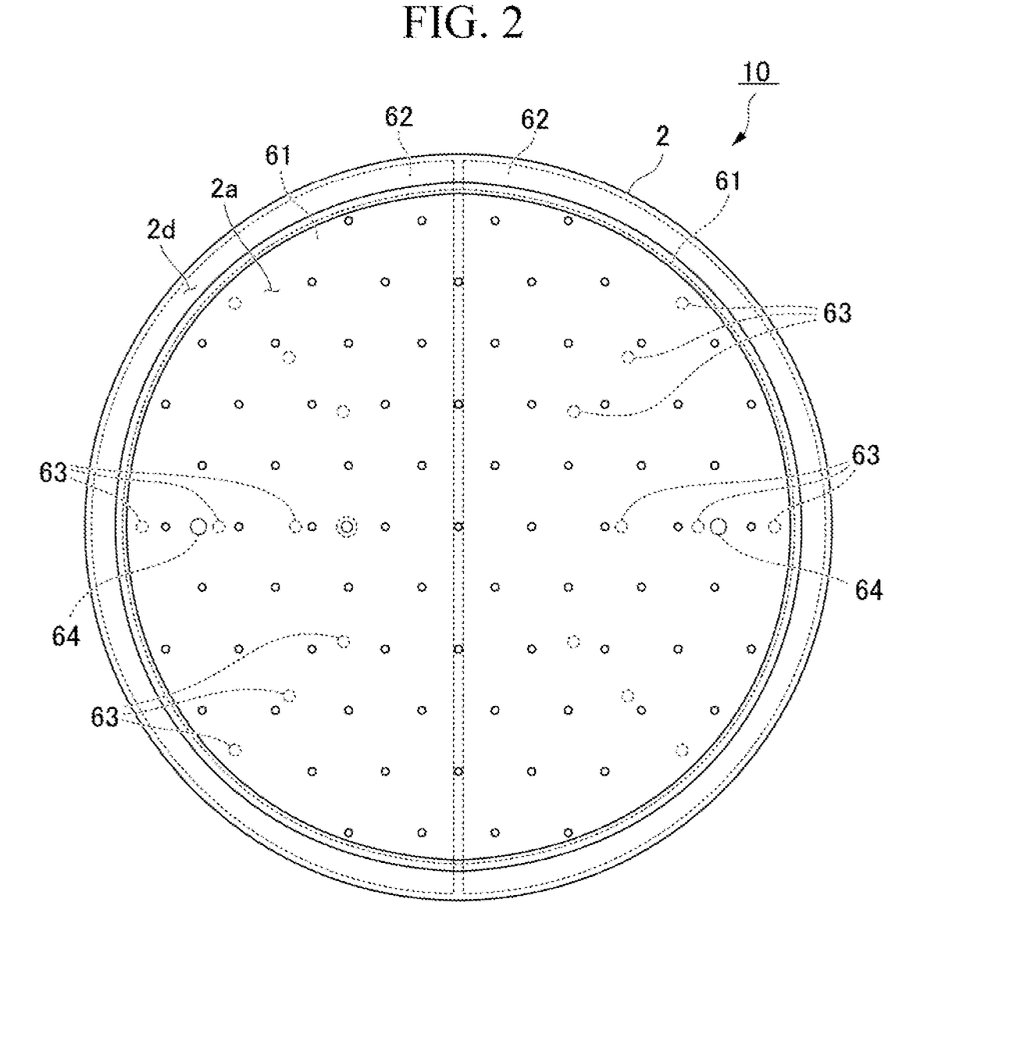
FIG. 2 is a schematic plan view of an electrostatic chuck plate.

FIG. 1 is a schematic cross-sectional view of a plasma treatment apparatus provided with the electrostatic chuck device of the present embodiment. FIG. 2 is a plan view of an electrostatic chuck plate.

A plasma treatment apparatus 100 includes a vacuum vessel 101 and an electrostatic chuck device 1 fixed in the vacuum vessel 101. The vacuum vessel 101 has a bottom wall 102, a tubular side wall 103 extending upward from the outer peripheral end of the bottom wall 102, and a top wall 104 fixed to the upper end of the side wall 103 and facing the bottom wall 102 in the up-down direction.

The electrostatic chuck device 1 is fixed to the bottom portion of the internal space of the vacuum vessel 101. The electrostatic chuck device 1 is fixed to the inside surface of the bottom wall 102 (upper surface in the drawing). The electrostatic chuck device 1 of the present embodiment is disposed in the vacuum vessel 101 with a placement surface 2a where a wafer W is placed facing upward. The form of disposition of the electrostatic chuck device 1 is an example, and the electrostatic chuck device 1 may be disposed in another form.

The bottom wall 102 of the vacuum vessel 101 has an opening portion 102a penetrating the bottom wall 102 in the thickness direction and an exhaust port 102b. The electrostatic chuck device 1 blocks the opening portion 102a from the inside of the vacuum vessel 101 (upper side in the drawing). The exhaust port 102b is positioned beside the electrostatic chuck device 1. A vacuum pump (not illustrated) is connected to the exhaust port 102b.

The electrostatic chuck device 1 includes an electrostatic chuck plate 10 adsorbing and supporting the wafer W and a metal base 11 supporting the electrostatic chuck plate 10. A focus ring 5 surrounding the placement surface 2a (wafer W) in plan view is disposed on the outer peripheral portion of the upper surface of the electrostatic chuck plate 10.

The electrostatic chuck plate 10 has a dielectric substrate 2 having the placement surface 2a where the wafer W is placed and an adsorption electrode 6 positioned in the dielectric substrate 2.

The dielectric substrate 2 is circular in plan view. The dielectric substrate 2 is made of a composite sintered body having mechanical strength and durability against a corrosive gas and the plasma thereof. Ceramics having mechanical strength and durability against a corrosive gas and the plasma thereof is preferably used as the dielectric material configuring the dielectric substrate 2. An aluminum oxide ($Al_2O_3$) sintered body, an aluminum nitride (AlN) sintered body, an aluminum oxide ($Al_2O_3$)-silicon carbide (SiC) composite sintered body, and so on are preferably used as the ceramics configuring the dielectric substrate 2.

The upper surface of the dielectric substrate 2 is the placement surface 2a where the wafer W is placed. A plurality of protrusion portions 21 are formed at predetermined intervals on the placement surface 2a. Each of the plurality of protrusion portions 21 has a diameter smaller than the thickness of the wafer W. The plurality of protrusion portions 21 of the placement surface 2a support the wafer W.

Any shape can be selected as the shape of the protrusion portion, and examples thereof include a columnar shape.

The electrostatic chuck plate 10 has a ring adsorption region 2d radially outside the placement surface 2a of the dielectric substrate 2. In the case of the present embodiment, the upper surface of the ring adsorption region 2d is positioned lower than the placement surface 2a in the up-down direction in the drawing. The focus ring 5 is disposed on the ring adsorption region 2d. As illustrated in FIG. 1, the outer peripheral portion of the focus ring 5 disposed in the ring adsorption region 2d protrudes radially outward beyond the dielectric substrate 2. The outer peripheral portion of the focus ring 5 protruding outward from the dielectric substrate 2 is disposed in a notch portion 4b of a side cover 4, which will be described later. The height position of the upper surface of the focus ring 5 (position in the up-down direction) substantially matches the height position of the upper surface of the wafer W placed on the placement surface 2a.

The focus ring 5 is formed of, for example, a material equivalent in electrical conductivity to the wafer W placed on the placement surface 2a. Specifically, silicon, silicon carbide, quartz, alumina, or the like can be used as the constituent material of the focus ring 5. By disposing the focus ring 5, it is possible to make the plasma-related electrical environment substantially match the wafer W in the peripheral edge portion of the wafer W. As a result, no difference or unevenness in plasma treatment is likely to occur between the middle and peripheral edge portions of the wafer W.

The adsorption electrode 6 is positioned in the dielectric substrate 2. The adsorption electrode 6 has two first electrode portions 61 positioned on the surface layer part of the dielectric substrate 2 on the placement surface 2a side, two second electrode portions 62 positioned on the surface layer part of the dielectric substrate 2 on the metal base 11 side, and a plurality of connection pins 63 connecting the first electrode portion 61 and the second electrode portion 62 in the dielectric substrate 2. It should be noted that the surface layer part may mean a position close to the surface and may not be exposed on the surface.

As illustrated in FIG. 2, each of the two first electrode portions 61 is semicircular in plan view. The two first electrode portions 61 are arranged in the planar direction of the dielectric substrate 2. The two first electrode portions 61 are disposed with linear edges facing each other and configure a circular bipolar electrode as a whole. The two first electrode portions 61 are disposed in a region overlapping the placement surface 2a in plan view.

Each of the two second electrode portions 62 is semicircular in plan view. The two second electrode portions 62 are arranged in the planar direction of the dielectric substrate 2. The two second electrode portions 62 are disposed with linear edges facing each other and configure a circular bipolar electrode as a whole. The plane area of the second electrode portion 62 is larger than the plane area of the first electrode portion 61. The second electrode portion 62 extends to the radial outside of the first electrode portion 61 in plan view. The two second electrode portions 62 are disposed in a region overlapping the placement surface 2a and the ring adsorption region 2d in plan view.

The connection pin 63 is positioned between the first electrode portion 61 and the second electrode portion 62 facing each other in the up-down direction. The upper end of the connection pin 63 is connected to the lower surface of the first electrode portion 61. The lower end of the connection pin 63 is connected to the upper surface of the second electrode portion 62. The electrostatic chuck plate 10 has 18 connection pins 63 as illustrated in FIG. 2. The connection pins 63 are not particularly limited in number and can be appropriately disposed in accordance with the plane area of the adsorption electrode 6 or the like. In a case where high-frequency power is input to the adsorption electrode 6, a high-frequency current easily flows along the outer peripheral portion of the electrode, and thus the plurality of connection pins 63 may be disposed only on the outer peripheral portion of the adsorption electrode 6.

The electrostatic chuck plate 10 has a gas hole 2e penetrating the dielectric substrate 2 in the up-down direction. The first electrode portion 61 and the second electrode portion 62 have through holes at positions corresponding to the gas hole 2e, and the first electrode portion 61 or the second electrode portion 62 is not exposed on the inner wall surface of the gas hole 2e. Two or more gas holes 2e may be provided.

A back surface 2b of the dielectric substrate 2 faces the upper surface of the metal base 11 in the up-down direction. In the case of the present embodiment, the electrostatic chuck plate 10 can be adsorbed to the metal base 11 by energizing the adsorption electrode 6. In the present embodiment, almost the entire back surface 2b of the dielectric substrate 2 is a base adsorption region 2f adsorbed to the metal base 11. A plurality of protrusion portions 22 are formed at predetermined intervals on the back surface 2b of the dielectric substrate 2. Each of the plurality of protrusion portions 22 has a diameter smaller than the thickness of the wafer W. The plurality of protrusion portions 22 of the back surface 2b form a narrow space between the metal base 11 and the dielectric substrate 2. Any shape can be selected as the shape of the protrusion portion, and examples thereof may include a columnar shape, a polygonal prism such as a triangular prism, a rectangular parallelepiped, and a cube.

The metal base 11 is a disk-shaped metal member in plan view. The metal base 11 is made of, for example, an aluminum alloy. The metal base 11 supports the electrostatic chuck plate 10 from the back surface 2b side. The metal base 11 is supported from below by a tubular support member 3 extending downward from the outer peripheral portion of the back surface of the metal base 11. The tubular side cover 4 surrounding the electrostatic chuck plate 10, the metal base 11, and the support member 3 is disposed outside the electrostatic chuck plate 10, the metal base 11, and the support member 3 in the radial direction.

The metal base 11 has a heater element 9 stretched inside. The heater element 9 and the metal base 11 are insulated from each other. A heater power supply device (not illustrated) is connected to the heater element 9. The heater element 9 may be provided outside the metal base 11. The heater element 9 may be disposed in the electrostatic chuck plate 10. The heater element 9 may be disposed between the electrostatic chuck plate 10 and the metal base 11.

The metal base 11 has two power supply terminals 13a and 13b. As illustrated in FIG. 1, the power supply terminal 13a is installed in a terminal installation hole 11a of the metal base 11. The power supply terminal 13b is installed in a terminal installation hole 11b. The terminal installation holes 11a and 11b are through holes penetrating the metal base 11 in the up-down direction.

The power supply terminal 13a has a cylindrical insulating tube 14 fixed to the upper end portion of the inner wall of the terminal installation hole 11a, a plunger installed in the insulating tube 14 so as to be movable upward and downward, a coil spring 16 applying an upward elastic force to the plunger 15, and a receiving plate 17 blocking the lower opening of the insulating tube 14 and supporting the coil spring 16 from below. The power supply terminal 13b has the same configuration as the power supply terminal 13a.

The insulating tube 14 has a length approximately equal to the thickness of the metal base 11. The insulating tube 14 insulates between the conductive components of the power supply terminals 13a and 13b and the metal base 11. The insulating tube 14 is made of, for example, alumina or the like.

The plunger 15 is a rod-shaped conductive terminal extending in the up-down direction. The plunger 15 is made of, for example, tungsten, stainless steel, nickel, or the like. The plunger 15 has a horizontally extending disk-shaped flange.

The coil spring 16 is a metallic spring body. The coil spring 16 is made of, for example, stainless steel, Inconel, or the like. The plunger 15 is inserted from the upper end portion of the coil spring 16. The upper end of the coil spring 16 comes into contact with the lower surface of the flange of the plunger 15.

The receiving plate 17 is a circular metal plate. The receiving plate 17 is made of, for example, Kovar, tungsten, or the like. The receiving plate 17 is fixed to the insulating tube 14. The coil spring 16 is sandwiched in the up-down direction by the flange of the plunger 15 and the receiving plate 17.

The upper end portions of the plungers 15 of the power supply terminals 13a and 13b protrude upward from the upper surface of the metal base 11. When the electrostatic chuck plate 10 is placed on the upper surface of the metal base 11, the upper end portion of the plunger 15 is pushed downward by the back surface 2b of the electrostatic chuck plate 10. By the plunger 15 being pushed upward by the coil spring 16, the contact state between the plunger 15 and the electrostatic chuck plate 10 is maintained.

The electrostatic chuck plate 10 has electrode terminals 64 at the respective positions of contact with the two plungers 15. The electrode terminals 64 respectively extend downward from the lower surfaces of the two second electrode portions 62 and are exposed on the back surface 2b of the dielectric substrate 2. By the plunger 15 and the electrode terminal 64 coming into contact with each other, the power supply terminal 13a is electrically connected to one second electrode portion 62 and the power supply terminal 13b is electrically connected to the other second electrode portion 62.

The power supply terminals 13a and 13b are connected to a power supply device 110 in the receiving plate 17. Therefore, the power supply device 110 and the second electrode portion 62 (adsorption electrode 6) are electrically connected via the power supply terminals 13a and 13b.

As illustrated in FIG. 1, the power supply device 110 includes a high-frequency power supply 111 for plasma excitation, a matching box 112, a DC power supply 113 for electrostatic adsorption, and a plurality of resistors 114 to 118.

The high-frequency power supply 111 for plasma excitation is electrically connected via the matching box 112 to a main power supply rod 8 extending downward from the lower surface of the metal base 11. The main power supply rod 8 is a metallic rod-shaped member made of, for example, aluminum, copper, stainless steel, or the like. The upper end of the main power supply rod 8 is fixed to the lower surface of the metal base 11. High-frequency power output from the high-frequency power supply 111 is supplied to the metal base 11 via the main power supply rod 8.

The DC power supply 113 for electrostatic adsorption is connected via the resistor 114 to the receiving plate 17 of the power supply terminal 13a. The DC power supply 113 is connected via the resistor 115 to the receiving plate 17 of the power supply terminal 13b. The voltage of the DC power supply 113 is applied to the two second electrode portions 62 via the power supply terminals 13a and 13b. The voltage of the DC power supply 113 is also applied to the first electrode portion 61 connected to the second electrode portion 62 via the connection pin 63.

In the case of the present embodiment, the negative terminal of the DC power supply 113 is connected to the output terminal of the matching box 112 via the resistor 116. In addition, the positive terminal of the DC power supply 113 is connected to the output terminal of the matching box 112 via the resistor 117. Further, the output terminal of the matching box 112 is connected to the ground via the resistor 118. With this configuration, positive and negative poles can be formed with reference to the ground with respect to the bipolar adsorption electrode 6.

The metal base 11 has a through hole 11c penetrating the metal base 11 in the up-down direction. A gas supply pipe 18 is connected to the lower opening portion of the through hole 11c. The end portion of the gas supply pipe 18 opposite to the through hole 11c is connected to a gas supply source (not illustrated). The gas supply pipe 18 is a pipe material made of an insulating material such as alumina.

The upper opening portion of the through hole 11c opens to the space between the dielectric substrate 2 and the metal base 11. In the case of the present embodiment, the through hole 11c is disposed at a position overlapping the gas hole 2e of the dielectric substrate 2 in plan view. In plan view, the position of the through hole 11c and the position of the gas hole 2e may be misaligned. The space in the through hole 11c is connected to the space between the dielectric substrate 2 and the metal base 11 and is further connected to the space between the placement surface 2a and the wafer W via the gas hole 2e. A cooling gas supplied from the gas supply source through the gas supply pipe 18 is supplied to the spaces of the upper and lower surfaces of the dielectric substrate 2 through the through hole 11c and the gas hole 2e.

The support member 3 has a cylindrical shape extending from the outer peripheral end of the lower surface of the metal base 11 toward the bottom wall 102. The support member 3 is a member made of an insulating material such as alumina. The lower end portion of the support member 3 is fixed to the upper surface of the bottom wall 102. The support member 3 is disposed along the peripheral edge of the opening portion 102a of the bottom wall 102. The space between the support member 3 and the bottom wall 102 is hermetically sealed by, for example, an O-ring.

The space inside the support member 3 is connected to the space outside the vacuum vessel 101 via the opening portion 102a of the bottom wall 102. The back surface 2b of the dielectric substrate 2 is exposed to the space inside the support member 3. A worker can access the back surface 2b of the dielectric substrate 2 through the opening portion 102a of the bottom wall 102.

The side cover 4 is a cylindrical member extending in the up-down direction. The side cover 4 covers the outside of the support member 3. In the case of the present embodiment, the side cover 4 faces a side end surface 2c of the dielectric substrate 2 and an outer peripheral surface 3b of the support member 3 in the radial direction. The side cover 4 protects the side end surface 2c of the dielectric substrate 2 and the outer peripheral surface 3b of the support member 3 from plasma. The side cover 4 is made of, for example, alumina, quartz, or the like. The material of the side cover 4 is not particularly limited insofar as the material has required plasma resistance. The electrostatic chuck device 1 can also be configured without the side cover 4.

An upper end portion 4a of the side cover 4 is positioned beside the dielectric substrate 2. The side cover 4 has the notch portion 4b extending along the inner peripheral edge in the corner portion on the inner peripheral side of the upper end portion 4a. The outer peripheral portion of the focus ring 5 is disposed inside the notch portion 4b. The height position of an upper end surface 4c of the side cover 4 (position in the up-down direction in the drawing) substantially matches the height position of the upper surface of the focus ring 5 and the height position of the upper surface of the wafer W.

In the electrostatic chuck device 1 having the above configuration, an electrostatic force is generated between the wafer W, the focus ring 5, and the metal base 11 and the adsorption electrode 6 by applying a DC voltage from the DC power supply 113 of the power supply device 110 to the bipolar adsorption electrode 6. As a result, the wafer W is adsorbed to the placement surface 2a of the electrostatic chuck plate 10 and the focus ring 5 is adsorbed to the ring adsorption region 2d. In addition, the back surface 2b of the electrostatic chuck plate 10 is adsorbed to the upper surface of the metal base 11.

In other words, the electrostatic chuck plate 10 of the present embodiment is a double-sided adsorption-type electrostatic chuck plate adsorbed to both the wafer W and the metal base 11. Further, the electrostatic chuck plate 10 has the ring adsorption region 2d adsorbed to the focus ring 5 on the surface on the same side as the placement surface 2a and has the base adsorption region 2f adsorbed to the metal base 11 on the back surface 2b opposite to the placement surface 2a.

According to this configuration, the electrostatic chuck plate 10 can be maintained in a state of being movable with respect to the metal base 11 by setting a state where no voltage is applied to the adsorption electrode 6. As a result, in the present embodiment, plasma treatment can be performed by keeping the electrostatic chuck plate 10 from being adsorbed to the metal base 11 until the wafer W reaches the treatment temperature when the wafer W is plasma-treated and bringing the electrostatic chuck plate 10 into an adsorption state after the wafer W reaches the treatment temperature.

According to the plasma treatment method described above, even if the electrostatic chuck plate 10 and the metal base 11 are expanded as the temperature rises, the electrostatic chuck plate 10 is movable on the metal base 11, and thus no stress is applied to the contact portion between the electrostatic chuck plate 10 and the metal base 11. Therefore, according to the present embodiment, excellent reliability is obtained when the wafer W is treated at a high temperature.

In addition, since the present embodiment is configured such that the focus ring 5 is placed on the electrostatic chuck plate 10, the focus ring 5 moves with respect to the metal base 11 together with the electrostatic chuck plate 10 in a non-adsorption state. Therefore, even if the electrostatic chuck plate 10 moves with respect to the metal base 11, the positional relationship between the focus ring 5 and the wafer W hardly fluctuates. By disposing the wafer W and the focus ring 5 at appropriate positions, plasma unevenness in the outer peripheral portion of the wafer W can be suppressed.

In the present embodiment, the electrostatic chuck plate 10 has a step between the placement surface 2a and the ring adsorption region 2d. The surface of the ring adsorption region 2d facing the focus ring 5 is positioned closer to the metal base 11 side than the placement surface 2a. According to this configuration, in a case where the focus ring 5 thicker than the wafer W is used, the step between the upper surface of the wafer W and the upper surface of the focus ring 5 is easily eliminated and plasma unevenness in the outer peripheral portion of the wafer W can be suppressed. In addition, the step makes it difficult for the focus ring 5 to move in the planar direction. Even in a case where the electrostatic chuck plate 10 moves with respect to the metal base 11, an appropriate positional relationship can be easily maintained between the focus ring 5 and the wafer W. It should be noted that in a case where the focus ring 5 can be held by the step of the electrostatic chuck plate 10, the electrostatic chuck plate 10 may be configured without the adsorption electrode 6 in the ring adsorption region 2d.

In the present embodiment, the adsorption electrode 6 has the first electrode portion 61 positioned on the surface layer part of the dielectric substrate 2 on the placement surface 2a side, the second electrode portion 62 positioned on the surface layer part of the dielectric substrate 2 on the metal base 11 side, and the connection pin 63 connecting the first electrode portion 61 and the second electrode portion 62 in the dielectric substrate 2.

According to this configuration, the first electrode portion 61 can be disposed in the vicinity of the placement surface 2a, the second electrode portion 62 can be disposed in the vicinity of the back surface 2b, and thus the force of adsorption to the wafer W and the metal base 11 can be enhanced.

Meanwhile, if the adsorption electrode 6 has a two-layer structure, the dielectric substrate 2 becomes thicker and the capacity of the electrostatic chuck plate 10 decreases, which leads to a disadvantage that it becomes difficult to excite plasma. In this respect, in the present embodiment, the connection pin 63 electrically connects the first electrode portion 61 and the second electrode portion 62, and thus the part of the dielectric substrate 2 positioned between the first electrode portion 61 and the second electrode portion 62 does not affect the capacity. Therefore, according to the electrostatic chuck plate 10 of the present embodiment, capacity equivalent to that in a case where the adsorption electrode 6 has a single-layer structure can be obtained and plasma can be easily excited.

The electrostatic chuck device 1 of the present embodiment has the plurality of protrusion portions 22 distributed in the planar direction of the electrostatic chuck plate 10 in the base adsorption region 2f of the electrostatic chuck plate 10. According to this configuration, a cooling gas is capable of flowing through the back surface 2b of the electrostatic chuck plate 10 as well, and thus the temperature uniformity of the electrostatic chuck plate 10 can be enhanced.

Although the electrostatic chuck plate 10 is configured to have the protrusion portion 22 in the present embodiment, in another configuration, a protrusion portion equivalent to the protrusion portion 22 may be provided on the upper surface of the metal base 11 (surface facing the base adsorption region 2f). In this case as well, a cooling gas is capable of flowing between the electrostatic chuck plate 10 and the metal base 11 and the temperature uniformity of the electrostatic chuck plate 10 and the wafer W can be enhanced.

It should be noted that although the electrostatic chuck plate 10 in the present embodiment is configured to be adsorbable to and detachable from the metal base 11, in another structure, a part of the back surface 2b of the electrostatic chuck plate 10 may be fixed to the metal base 11. For example, the electrostatic chuck plate 10 may be configured to have a base fixing portion fixed to the upper surface of the metal base 11 in the middle portion of the back surface 2b in plan view. The fixing may be performed by adhesion, screwing, or the like. The position of the base fixing portion may not be the middle portion of the back surface 2b and may be provided at a plurality of locations on the back surface 2b.

Further, a fitting structure for misalignment prevention may be provided between the electrostatic chuck plate 10 and the metal base 11. For example, the electrostatic chuck plate 10 may be provided with a recess recessed upward from the back surface 2b and the metal base 11 may be provided with a protrusion fitting into the recess. In the fitting structure, each of the recess and the protrusion may have a tapered side surface. According to this configuration, when the electrostatic chuck plate 10 is placed on the metal base 11, the electrostatic chuck plate 10 can be easily guided to a predetermined position and misalignment with the metal base 11 is unlikely to occur.

In addition, in the fitting structure, the recess of the electrostatic chuck plate 10 and the protrusion of the metal base 11 may be bonded together to form a base fixing portion.

In the fitting structure, the positions of the recess and the protrusion may be interchanged. In other words, the upper surface of the metal base 11 may be provided with a recess recessed downward and the electrostatic chuck plate 10 may be provided with a protrusion fitting into the recess of the metal base material 11.

In the case of the configuration having the base fixing portion, the region of the back surface 2b of the electrostatic chuck plate 10 other than the fixing part is a base adsorption region adsorbable to the metal base 11. In the case of such a configuration as well, by keeping the electrostatic chuck plate 10 in a non-adsorption state when the wafer W is heated, at least the base adsorption region of the back surface 2b is movable relative to the metal base 11, and thus the stress acting between the electrostatic chuck plate 10 and the metal base 11 can be reduced. In a case where the base fixing portion is positioned in the middle portion of the back surface 2b, the base adsorption region surrounds the base fixing portion, and thus the stress reduction effect described above can be easily obtained.

In addition, another configuration may be adopted although a case where the electrode that adsorbs the focus ring 5 is the second electrode portion 62 has been described in the present embodiment. For example, the adsorption electrode 6 may be configured to have a third electrode portion positioned closer to the outer peripheral side than the first electrode portion 61 and positioned on the surface layer part of the ring adsorption region 2d. The third electrode portion may be configured to be electrically connected to at least one of the first electrode portion 61 and the second electrode portion 62 or may be configured to be connected to a power supply of a system separate from the first electrode portion 61 and the second electrode portion 62.

According to this configuration, the third electrode portion can be disposed closer to the surface layer part of the ring adsorption region 2d than the second electrode portion 62, and thus the force of adsorption can be enhanced with respect to the focus ring 5. It should be noted that the third electrode portion may be formed by extending the first electrode portion 61 to the ring adsorption region 2d. In this case, the first electrode portion 61 is bent along the step between the placement surface 2a and the ring adsorption region 2d.

Modification Example

A modification example of the first embodiment will be described with reference to FIGS. 3A and 3B.

Figure 3A:
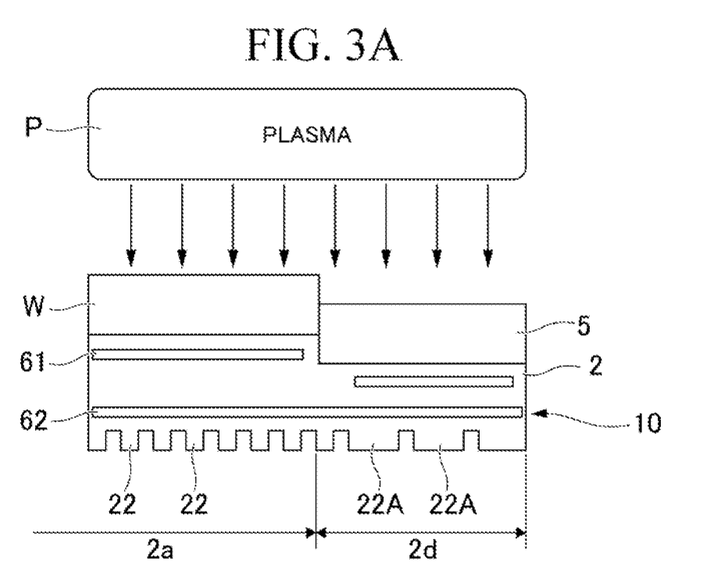
FIG. 3A is a partial schematic cross-sectional view of the outer peripheral portion of an electrostatic chuck plate 10 of a modification example.

FIG. 3A is a partial cross-sectional view of the outer peripheral portion of the electrostatic chuck plate 10 of the modification example. FIG. 3B is a partial cross-sectional view illustrating a worn state of the focus ring 5 in the electrostatic chuck plate 10 of the first embodiment.

Figure 3B:
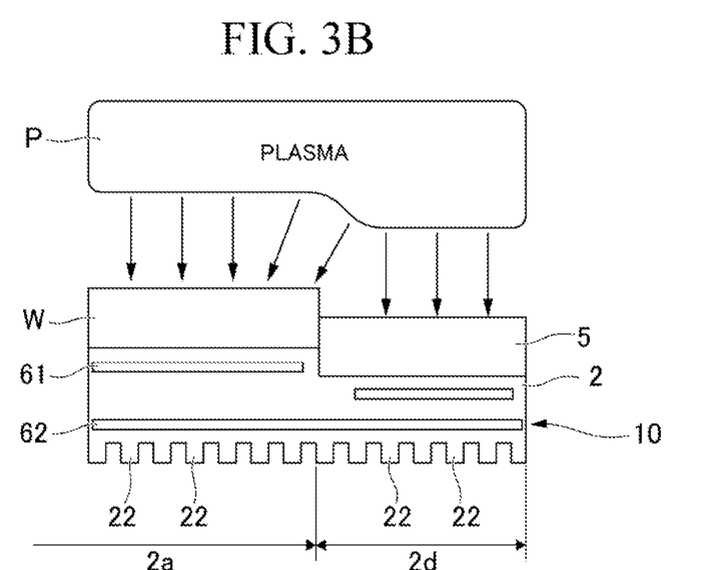
FIG. 3B is a partial schematic cross-sectional view illustrating a worn state of a focus ring 5 in the electrostatic chuck plate 10 of a first embodiment.

As illustrated in FIG. 3B, in a case where the focus ring 5 is worn out and thinned, the capacity of the focus ring 5 becomes relatively large, and thus the electron density of plasma P on the focus ring 5 increases relative to that on the wafer W. As compared with a case where the focus ring 5 that is not worn out is used, the plasma distribution becomes non-uniform and treatment unevenness is likely to occur in the outer peripheral portion of the wafer W.

In this regard, in a case where the focus ring 5 is worn out, the plasma distribution can be easily maintained by replacement with the electrostatic chuck plate 10 of the modification example illustrated in FIG. 3A.

In the case of the configuration illustrated in FIG. 3A, in the electrostatic chuck plate 10 of the modification example, a protrusion portion 22A provided on the back surface 2b in the region overlapping the ring adsorption region 2d is larger in diameter than the protrusion portion 22 provided in the region overlapping the placement surface 2a. According to this configuration, the ratio of the dielectric in the ring adsorption region 2d of the electrostatic chuck plate 10 can be increased, and thus the overall capacity change can be reduced even in a case where the worn focus ring 5 is used. As a result, non-uniformity in plasma can be suppressed.

The protrusion portion 22A in the region overlapping the ring adsorption region 2d may have a configuration other than the large-diameter protrusion portion illustrated in FIG. 3A. For example, the protrusion portion 22A may be configured to be higher in disposition density than the protrusion portion 22. More specifically, the protrusion portion 22A in the region overlapping the ring adsorption region 2d may be configured to be equivalent in diameter to and higher in disposition density than the protrusion portion 22 in the region overlapping the placement surface 2a.

Further, depending on the configuration of the focus ring 5, the protrusion portion 22A in the region overlapping the ring adsorption region 2d may be smaller in diameter than the protrusion portion 22 in the region overlapping the placement surface 2a. Alternatively, the protrusion portion 22A in the region overlapping the ring adsorption region 2d may be lower in disposition density than the protrusion portion 22 in the region overlapping the placement surface 2a. With such a configuration, the focus ring 5 that is thick can be used.

In the electrostatic chuck plate 10 of the modification example described above, the distribution density of the plurality of protrusion portions 22 is different between the region of the base adsorption region 2f overlapping the placement surface 2a in plan view and the region of the base adsorption region 2f overlapping the ring adsorption region 2d in plan view.

According to this configuration, by changing the electrostatic chuck plate 10 in accordance with the thickness of the focus ring 5, non-uniform plasma distribution can be suppressed in the outer peripheral portion of the wafer W. Treatment unevenness can be reduced in the outer peripheral portion of the wafer W.

It should be noted that although the electrostatic chuck plate 10 in the modification example is configured to have the protrusion portions 22 and 22A, in another configuration, a protrusion portion equivalent to the protrusion portions 22 and 22A may be provided on the upper surface of the metal base 11 (surface facing the base adsorption region 2f).

Second Embodiment

Figure 4:
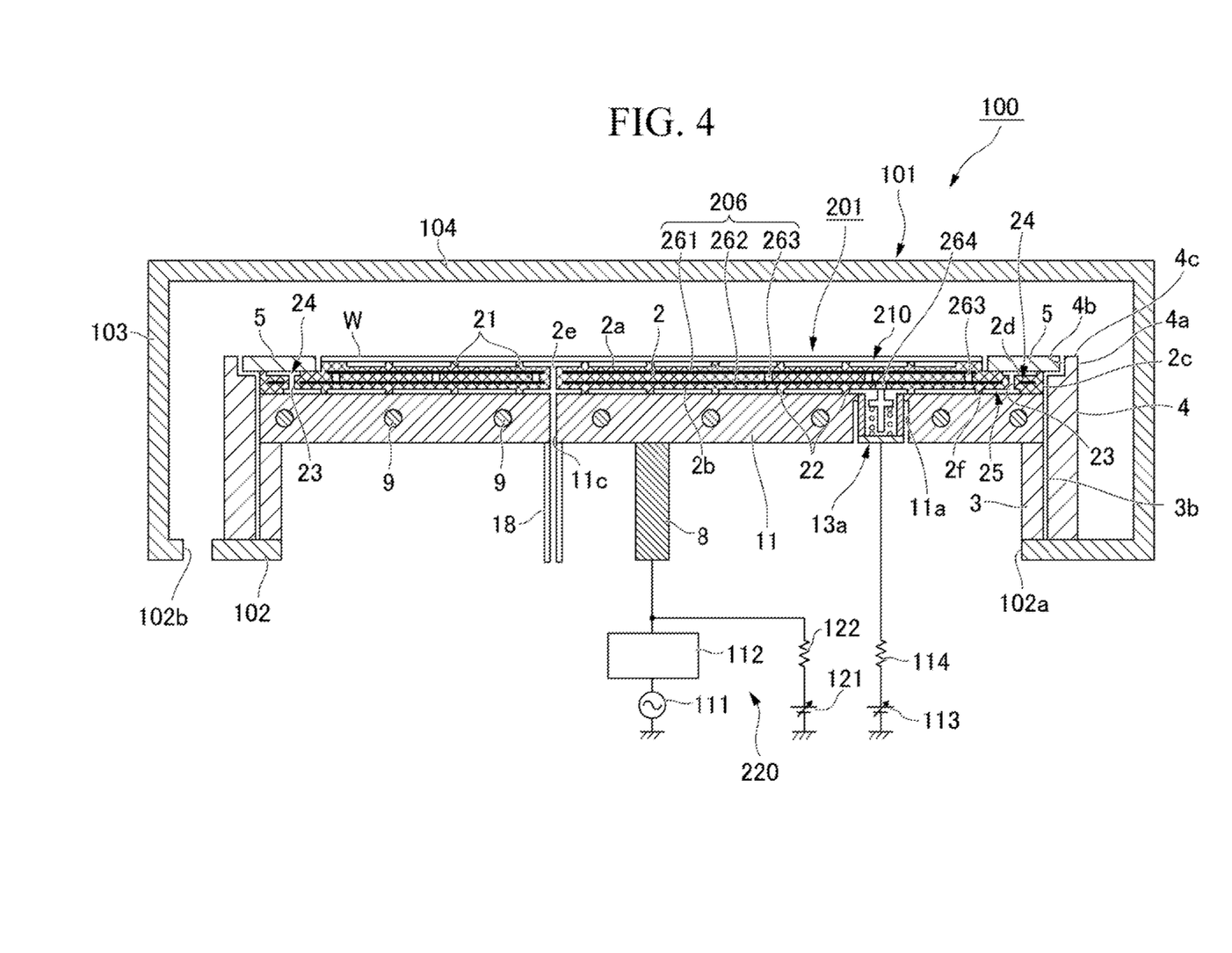
FIG. 4 is a schematic cross-sectional view illustrating a preferred example of a plasma treatment apparatus provided with an electrostatic chuck device 201 of a second embodiment.

FIG. 4 is a cross-sectional view of a plasma treatment apparatus including an electrostatic chuck device 201 according to a second embodiment. In FIG. 4, components denoted by the same reference numerals as in FIGS. 1 to 3 are identical to those of the electrostatic chuck device 1 of the first embodiment.

The electrostatic chuck device 201 of the second embodiment includes an electrostatic chuck plate 210 having a unipolar adsorption electrode 206, the focus ring 5 disposed on the outer peripheral portion of the electrostatic chuck plate 210, the metal base 11 supporting the electrostatic chuck plate 210 from below, the support member 3 supporting the metal base 11, and the side cover 4 positioned radially outside the support member 3.

The adsorption electrode 206 has a first electrode portion 261 positioned on the surface layer part of the dielectric substrate 2 on the placement surface 2a side, a second electrode portion 262 positioned on the surface layer part of the dielectric substrate 2 on the metal base 11 side, and a plurality of connection pins 263 connecting the first electrode portion 261 and the second electrode portion 262 in the dielectric substrate 2.

Both the first electrode portion 261 and the second electrode portion 262 of the present embodiment are circular in plan view. The diameter of the second electrode portion 262 is larger than the diameter of the first electrode portion 261. The first electrode portion 261 is disposed in a region overlapping the placement surface 2a of the dielectric substrate 2 in plan view. The second electrode portion 262 extends radially outward beyond the outer peripheral end of the first electrode portion 261. The outer peripheral portion of the second electrode portion 262 overlaps the ring adsorption region 2d in plan view.

The connection pins 263 are disposed at a plurality of locations in the region where the first electrode portion 261 and the second electrode portion 262 overlap in plan view. The connection pins 263 are identical in number and disposition to the connection pins 63 of the first embodiment illustrated in FIG. 2. The number and disposition of the connection pins 263 can be appropriately changed in accordance with the plane area of the adsorption electrode 206, the type of the current flowing through the adsorption electrode 206 (DC or AC), the magnitude thereof, and so on.

The electrostatic chuck plate 210 has an electrode terminal 264 extending downward from the lower surface of the second electrode portion 262. The lower end portion of the electrode terminal 264 is exposed on the back surface 2b of the dielectric substrate 2. In the case of the present embodiment, the adsorption electrode 206 is a unipolar electrode, and thus only the power supply terminal 13a of the metal base 11 is connected to the adsorption electrode 206. The upper end of the plunger 15 of the power supply terminal 13a comes into contact with the electrode terminal 264 of the electrostatic chuck plate 210. The DC power supply 113 for electrostatic adsorption is connected to the power supply terminal 13a via the resistor 114. In the case of the present embodiment, the adsorption electrode 206 is connected to the positive terminal of the DC power supply 113.

The electrostatic chuck plate 210 has a plurality of through holes 23 penetrating the dielectric substrate 2 in the ring adsorption region 2d and a groove 24 opening to the upper surface of the ring adsorption region 2d. In plan view, the groove 24 has a circular ring shape extending along the ring adsorption region 2d. The width of the groove 24 is smaller than the width of the focus ring 5. The upper opening of the groove 24 is blocked by the focus ring 5 adsorbed to the ring adsorption region 2d.

The through hole 23 opens to the bottom surface of the groove 24 and the back surface 2b of the dielectric substrate 2. Therefore, the groove 24 is connected to a gap 25 between the back surface 2b of the dielectric substrate 2 and the metal base 11 via the through hole 23. A cooling gas supplied to the gap 25 via the gas supply pipe 18 and the through hole 11c of the metal base 11 flows into the groove 24 through the through hole 23. The cooling of the focus ring 5 is promoted by the configuration having the groove 24.

A power supply device 220 is connected to the main power supply rod 8 extending downward from the lower surface of the metal base 11. The power supply device 220 has the high-frequency power supply 111 for plasma excitation, the matching box 112, a DC power supply 121 for bias voltage application, and a resistor 122. The high-frequency power supply 111 is connected to the main power supply rod 8 via the matching box 112. The DC power supply 121 is connected to the main power supply rod 8 via the resistor 122.

In the electrostatic chuck device 201 of the second embodiment having the above configuration, by applying a voltage to the adsorption electrode 6 from the DC power supply 113, the wafer W can be adsorbed to the placement surface 2a of the electrostatic chuck plate 210 and the back surface 2b of the electrostatic chuck plate 210 can be adsorbed to the upper surface of the metal base 11.

Also in the electrostatic chuck device 201 of the second embodiment, by including the double-sided adsorption-type electrostatic chuck plate 210, when the wafer W is heated, the electrostatic chuck plate 210 can be set in a non-adsorption state and movable on the metal base 11. As a result, as in the first embodiment, damage to the electrostatic chuck device 201 attributable to thermal stress can be prevented. Therefore, according to the electrostatic chuck device 201 of the second embodiment, the wafer W can be treated at a high temperature.

The electrostatic chuck plate 210 of the second embodiment has the adsorption electrode 206 having a two-layer structure. Each of the first electrode portion 261 and the second electrode portion 262 is disposed near an object to be adsorbed, and thus a high adsorption force can be obtained.

In the present embodiment as well, since the first electrode portion 261 and the second electrode portion 262 are connected via the connection pin 263, the substantial capacity of the electrostatic chuck plate 210 does not increase even in a case where the relatively thick dielectric substrate 2 is used. Therefore, in the electrostatic chuck device 201 of the present embodiment, plasma can be easily excited by power input from the high-frequency power supply 111 to the metal base 11.

It should be noted that the electrostatic chuck device 201 of the second embodiment can be appropriately combined with the configurations of the first embodiment, the modification example, and a third embodiment described in this specification insofar as the combination is not contradictory.

Third Embodiment

Figure 5:
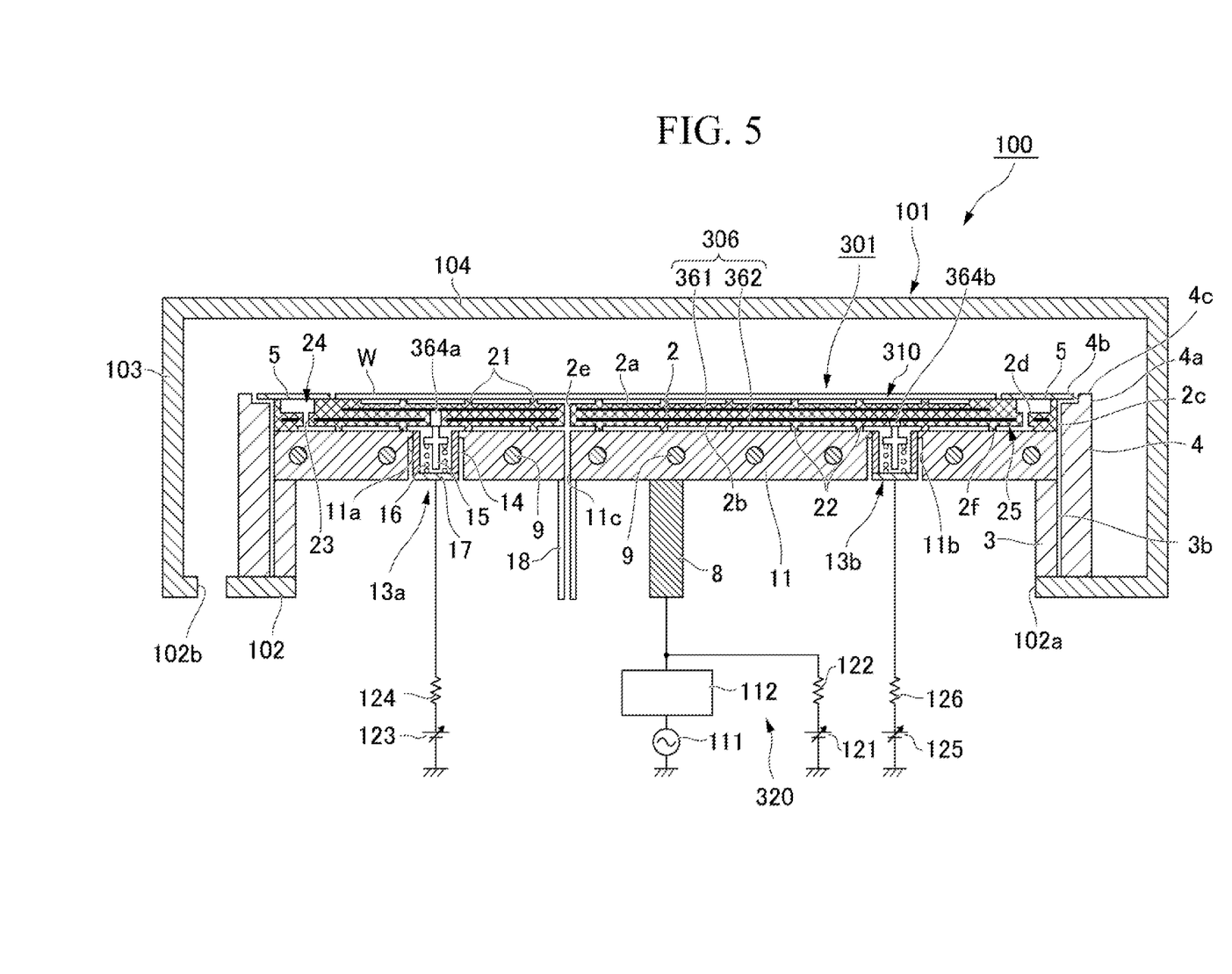
FIG. 5 is a schematic cross-sectional view illustrating a preferred example of a plasma treatment apparatus provided with an electrostatic chuck device 301 of a third embodiment.

FIG. 5 is a cross-sectional view of a plasma treatment apparatus including an electrostatic chuck device 301 of the third embodiment. In FIG. 5, components denoted by the same reference numerals as in FIGS. 1 to 4 are identical to those of the electrostatic chuck device 1 of the first embodiment or the electrostatic chuck device 201 of the second embodiment.

The electrostatic chuck device 301 of the third embodiment includes an electrostatic chuck plate 310 having a unipolar adsorption electrode 306, the focus ring 5 disposed on the outer peripheral portion of the electrostatic chuck plate 310, the metal base 11 supporting the electrostatic chuck plate 310 from below, the support member 3 supporting the metal base 11, and the side cover 4 positioned radially outside the support member 3.

The adsorption electrode 306 has a first electrode portion 361 positioned on the surface layer part of the dielectric substrate 2 on the placement surface 2a side and a second electrode portion 362 positioned on the surface layer part of the dielectric substrate 2 on the metal base 11 side. Both the first electrode portion 361 and the second electrode portion 362 of the present embodiment are circular in plan view. The diameter of the second electrode portion 362 is larger than the diameter of the first electrode portion 361. The first electrode portion 361 is disposed in the region overlapping the placement surface 2a of the dielectric substrate 2 in plan view. The second electrode portion 362 extends radially outward beyond the outer peripheral end of the first electrode portion 361. The outer peripheral portion of the second electrode portion 362 overlaps the ring adsorption region 2d in plan view.

The electrostatic chuck plate 310 has an electrode terminal 364a extending downward from the lower surface of the first electrode portion 361 and an electrode terminal 364b extending downward from the lower surface of the second electrode portion 362. Each of the lower end portions of the electrode terminals 364a and 364b is exposed on the back surface 2b of the dielectric substrate 2. The electrode terminal 364a comes into contact with the plunger 15 of the power supply terminal 13a protruding from the upper surface of the metal base 11. The electrode terminal 364b comes into contact with the plunger 15 of the power supply terminal 13b protruding from the upper surface of the metal base 11.

A DC power supply 123 for electrostatic adsorption is connected to the power supply terminal 13a via a resistor 124. In the case of the present embodiment, the power supply terminal 13a is electrically connected to the positive terminal of the DC power supply 123.

A DC power supply 125 for electrostatic adsorption is connected to the power supply terminal 13b via a resistor 126. In the case of the present embodiment, the power supply terminal 13b is electrically connected to the positive terminal of the DC power supply 125.

A power supply device 320 is connected to the main power supply rod 8 extending downward from the lower surface of the metal base 11. The power supply device 320 has the high-frequency power supply 111 for plasma excitation, the matching box 112, the DC power supply 121 for bias voltage application, and the resistor 122. The high-frequency power supply 111 is connected to the main power supply rod 8 via the matching box 112. The DC power supply 121 is connected to the main power supply rod 8 via the resistor 122.

In the electrostatic chuck device 201 of the third embodiment having the above configuration, the wafer W can be adsorbed to the placement surface 2a of the electrostatic chuck plate 310 by applying a voltage from the DC power supply 123 to the first electrode portion 361. In addition, the back surface 2b of the electrostatic chuck plate 310 can be adsorbed to the upper surface of the metal base 11 by applying a voltage from the DC power supply 125 to the second electrode portion 362.

Also in the electrostatic chuck device 301 of the third embodiment, by including the double-sided adsorption-type electrostatic chuck plate 310, when the wafer W is heated, the electrostatic chuck plate 310 can be set in a non-adsorption state and movable on the metal base 11. As a result, as in the first embodiment, damage to the electrostatic chuck device 301 attributable to thermal stress can be prevented. Therefore, according to the electrostatic chuck device 301 of the third embodiment, the wafer W can be treated at a high temperature.

The electrostatic chuck plate 310 of the third embodiment has the adsorption electrode 306 having a two-layer structure. Each of the first electrode portion 361 and the second electrode portion 362 is disposed near an object to be adsorbed, and thus a high adsorption force can be obtained.

In the present embodiment, the first electrode portion 361 and the second electrode portion 362 are connected to the DC power supplies 123 and 125 different from each other. According to this configuration, the potential of the first electrode portion 361 adsorbing the wafer W and the potential of the second electrode portion 362 adsorbing the metal base 11 and the focus ring 5 can be easily adjusted to appropriate potentials. Poor adsorption and poor heating are unlikely to occur, and the yield of plasma treatment can be improved.

It should be noted that the electrostatic chuck device 301 of the third embodiment can be appropriately combined with the configurations of the first embodiment, the modification example, and the second embodiment described in this specification insofar as the combination is not contradictory.

INDUSTRIAL APPLICABILITY

According to the present invention, it is possible to provide a wafer support device and an electrostatic chuck device highly reliable when used at high temperatures. According to the present invention, it is possible to provide an electrostatic chuck plate capable of double-sided chucking.

REFERENCE SIGNS LIST 1, 201, 301: Electrostatic chuck device
2: Dielectric substrate
2a: Placement surface
2b: Back surface
2c: Side end surface
2d: Ring adsorption region
2e: Gas hole
2f: Base adsorption region
3: Tubular support member
3b: Outer peripheral surface
4: Side cover
4a: Upper end portion
4b: Notch portion
4c: Upper end surface
5: Focus ring
6, 206, 306: Adsorption electrode
8: Main power supply rod
9: Heater element
10, 210, 310: Electrostatic chuck plate
11: Metal base
11a, 11b: Terminal installation hole
11c: Through hole
13a, 13b: Power supply terminal
14: Insulating tube
15: Plunger
16: Coil spring
17: Plate
18: Gas supply pipe
21, 22, 22A: Protrusion portion
23: Through hole
24: Groove
25: Gap
61, 261, 361: First electrode portion
62, 262, 362: Second electrode portion
63, 263: Connection pin
64, 264, 364, 364a, 364b: Electrode terminal
100: Plasma treatment apparatus
101: Vacuum vessel
102: Bottom wall
102a: Opening portion
102b: Exhaust port
103: Tubular side wall
104: Top wall
110: Power supply device
111: High-frequency power supply
112: Matching box
113: DC power supply
114, 115, 116, 117, 118, 122, 124, 126: Resistor
121, 123, 125: DC power supply
210: Electrostatic chuck plate
220: Power supply device
P: Plasma
W: Wafer

The invention claimed is:

1. An electrostatic chuck device comprising:
an electrostatic chuck plate which has
a dielectric substrate having a placement surface on which a wafer is placed and
an adsorption electrode which is positioned in the dielectric substrate;
a metal base which supports the electrostatic chuck plate from a back surface side opposite to the placement surface; and
a focus ring which is installed on an outer peripheral portion of the electrostatic chuck plate and surrounds the placement surface,
wherein the electrostatic chuck plate has
a ring adsorption region, which is adsorbed to the focus ring and is located on a surface which is positioned on a same side as the placement surface, and
a base adsorption region, which is adsorbed to the metal base and is located on a back surface which is opposite to the placement surface,
wherein one or both of the base adsorption region of the electrostatic chuck plate and a surface of the metal base which faces the base adsorption region, have a plurality of protrusion portions which are distributed in a planar direction of the electrostatic chuck plate, and
distribution density of the plurality of protrusion portions in the base adsorption region is different between a region overlapping the placement surface in plan view and a region overlapping the ring adsorption region in plan view.

2. The electrostatic chuck device according to claim 1, wherein the electrostatic chuck plate has a step which is located between the placement surface and the ring adsorption region, and a surface of the ring adsorption region which faces the focus ring is positioned closer to the metal base than the placement surface.

3. The electrostatic chuck device according to claim 1, wherein the electrostatic chuck plate has a base fixing portion which is fixed to the metal base and is located in a middle portion of the back surface thereof in plan view, and
the base adsorption region is disposed to surround the base fixing portion.

4. The electrostatic chuck device according to claim 1, wherein the electrostatic chuck plate is a double-sided adsorption-type electrostatic chuck plate.

5. The electrostatic chuck device according to claim 1, wherein both the base adsorption region of the electrostatic chuck plate and the surface of the metal base which faces the base adsorption region have the plurality of protrusion portions which are distributed in the planar direction of the electrostatic chuck plate.

6. The electrostatic chuck device according to claim 1, wherein in the base adsorption region, diameter of the protrusion portions located in the region thereof overlapping the ring adsorption region in plan view is larger than diameter of the protrusion portions located in the region thereof overlapping the placement surface in plan view.

7. The electrostatic chuck device according to claim 1, wherein in the base adsorption region, disposition density of the protrusion portions located in the region thereof overlapping the ring adsorption region in plan view is higher than disposition density of the protrusion portions located in the region thereof overlapping the placement surface in plan view.

8. The electrostatic chuck device according to claim 1, wherein in the base adsorption region, diameter of the protrusion portions in the region thereof overlapping the ring adsorption region in plan view is smaller than diameter of the protrusion portions located in the region thereof overlapping the placement surface in plan view.

9. The electrostatic chuck device according to claim 1, wherein in the base adsorption region, disposition density of the protrusion portion located in the region thereof overlapping the ring adsorption region in plan view is lower than disposition density of the protrusion portions located in the region thereof overlapping the placement surface in plan view.

10. An electrostatic chuck device comprising:
an electrostatic chuck plate which has
a dielectric substrate having a placement surface on which a wafer is placed and
an adsorption electrode which is positioned in the dielectric substrate;
a metal base which supports the electrostatic chuck plate from a back surface side opposite to the placement surface; and
a focus ring which is installed on an outer peripheral portion of the electrostatic chuck plate and surrounds the placement surface,
wherein the electrostatic chuck plate has
a ring adsorption region, which is adsorbed to the focus ring and is located on a surface which is positioned on a same side as the placement surface, and
a base adsorption region, which is adsorbed to the metal base and is located on a back surface which is opposite to the placement surface,
wherein the adsorption electrode has a first electrode portion which is positioned in a surface layer part of the dielectric substrate which is located on a placement surface side,
a second electrode portion which is positioned in a surface layer part of the dielectric substrate which is located on a metal base side, and
a connection pin which connects the first electrode portion and the second electrode portion in the dielectric substrate,
wherein the first electrode portion is a bipolar electrode which is a circular as a whole and consists of two semicircular pieces in plan view,
the second electrode portion is a bipolar electrode which is circular as a whole and consists of two semicircular pieces in plan view,
a plane area of the second electrode portion is larger than a plane area of the first electrode portion,
the first electrode portion overlaps the placement surface in plan view, and
the second electrode portion overlaps the placement surface and the ring adsorption region in plan view.

11. The electrostatic chuck device according to claim 10, wherein the adsorption electrode has a third electrode portion which is positioned closer to an outer peripheral side than the first electrode portion and is positioned on a surface layer part of the ring adsorption region.

12. The electrostatic chuck device according to claim 10, wherein the electrostatic chuck plate has a step which is located between the placement surface and the ring adsorption region, and a surface of the ring adsorption region which faces the focus ring is positioned closer to the metal base than the placement surface.

13. The electrostatic chuck device according to claim 10, wherein the electrostatic chuck plate has a base fixing portion which is fixed to the metal base and is located in a middle portion of the back surface thereof in plan view, and the base adsorption region is disposed to surround the base fixing portion.

14. The electrostatic chuck device according to claim 10, wherein the electrostatic chuck plate is a double-sided adsorption-type electrostatic chuck plate.

15. The electrostatic chuck device according to claim 10, wherein the electrostatic chuck plate has electrode terminals, which respectively extend downward from a lower surface of the first electrode portion and a lower surface of the second electrode portion, the metal base has a power supply terminal which supplies power to the first electrode portion via the electrode terminal and a power supply terminal which supplies power to the second electrode portion via the electrode terminal, and the power supply terminals have a cylindrical insulating tube, a plunger installed provided in the insulating tube so as to be movable upward and downward, a coil spring which applies an upward elastic force to the plunger, and a receiving plate which blocks a lower opening of the insulating tube and supports the coil spring from below.

16. An electrostatic chuck device comprising:
an electrostatic chuck plate which has
a dielectric substrate having a placement surface on which a wafer is placed and
an adsorption electrode which is positioned in the dielectric substrate;
a metal base which supports the electrostatic chuck plate from a back surface side opposite to the placement surface; and a focus ring which is installed on an outer peripheral portion of the electrostatic chuck plate and surrounds the placement surface, wherein the electrostatic chuck plate has
- a ring adsorption region, which is adsorbed to the focus ring and is located on a surface which is positioned on a same side as the placement surface, and
- a base adsorption region, which is adsorbed to the metal base and is located on a back surface which is opposite to the placement surface, wherein the adsorption electrode has
- a first electrode portion which is positioned in a surface layer part of the dielectric substrate which is located on a placement surface side,
- a second electrode portion which is positioned in a surface layer part of the dielectric substrate which is located on a metal base side, and
- a connection pin which connects the first electrode portion and the second electrode portion in the dielectric substrate, wherein the first electrode portion is a circular electrode,
the second electrode portion is a circular electrode,
a plane area of the second electrode portion is larger than a plane area of the first electrode portion,
the first electrode portion overlaps the placement surface in plan view, and
the second electrode portion overlaps the placement surface and the ring adsorption region in plan view.

17. The electrostatic chuck device according to claim 16, wherein the adsorption electrode has a third electrode portion which is positioned closer to an outer peripheral side than the first electrode portion and is positioned on a surface layer part of the ring adsorption region.

18. The electrostatic chuck device according to claim 16, wherein the electrostatic chuck plate has a step which is located between the placement surface and the ring adsorption region, and a surface of the ring adsorption region which faces the focus ring is positioned closer to the metal base than the placement surface.

19. The electrostatic chuck device according to claim 16, wherein the electrostatic chuck plate has a base fixing portion which is fixed to the metal base and is located in a middle portion of the back surface thereof in plan view, and the base adsorption region is disposed to surround the base fixing portion.

20. The electrostatic chuck device according to claim 16, wherein the electrostatic chuck plate has electrode terminals, which respectively extend downward from a lower surface of the first electrode portion and a lower surface of the second electrode portion, the metal base has a power supply terminal which supplies power to the first electrode portion via the electrode terminal and a power supply terminal which supplies power to the second electrode portion via the electrode terminal, and the power supply terminals have a cylindrical insulating tube, a plunger installed provided in the insulating tube so as to be movable upward and downward, a coil spring which applies an upward elastic force to the plunger, and a receiving plate which blocks a lower opening of the insulating tube and supports the coil spring from below.

* * * * *